United States Patent
Matsumoto et al.

(10) Patent No.: US 7,855,458 B2
(45) Date of Patent: Dec. 21, 2010

(54) ELECTRONIC COMPONENT

(75) Inventors: Tsuyoshi Matsumoto, Kawasaki (JP); Yoshihiro Mizuno, Kawasaki (JP); Xiaoyu Mi, Kawasaki (JP); Hisao Okuda, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 801 days.

(21) Appl. No.: 11/585,877

(22) Filed: Oct. 25, 2006

(65) Prior Publication Data

US 2007/0158848 A1 Jul. 12, 2007

(30) Foreign Application Priority Data

Dec. 21, 2005 (JP) ............... 2005-367673

(51) Int. Cl.
H01L 23/48 (2006.01)
H01L 23/52 (2006.01)
H01L 29/40 (2006.01)

(52) U.S. Cl. ............ 257/762; 257/767; 257/751; 257/368; 257/E21.017; 257/E21.582

(58) Field of Classification Search .......... 257/762, 257/758, 751, 368, 306, E21.17, E21.582
See application file for complete search history.

(56) References Cited

U.S. PATENT DOCUMENTS 6,023,407 A 2/2000 Farooq et al. ............... 361/303
2003/0211699 A1* 11/2003 Lin et al. ................... 438/397
2003/0213615 A1* 11/2003 Utsumi et al. .............. 174/257
2005/0037535 A1* 2/2005 Ogawa et al. .............. 438/106
2005/0045891 A1* 3/2005 Yamazaki et al. ........... 257/72
2005/0104220 A1* 5/2005 Tsuchiya et al. ............ 257/774
2005/0175938 A1* 8/2005 Casper et al. .............. 430/319
2006/0097344 A1* 5/2006 Casper et al. .............. 257/528
2006/0131069 A1* 6/2006 Shimizu et al. ............ 174/260
2006/0157766 A1* 7/2006 Won et al. ................. 257/296

FOREIGN PATENT DOCUMENTS

| JP | 4-61264 | 2/1992 |
| JP | 9-102590 | 4/1997 |
| JP | 2000-68645 | 3/2000 |
| JP | 2002-33239 | 1/2002 |

OTHER PUBLICATIONS

Search Report corresponding to Chinese application No. 200610144641X dated Mar. 20, 2009.

* cited by examiner

*Primary Examiner*—Zandra Smith
*Assistant Examiner*—Telly D Green
(74) *Attorney, Agent, or Firm*—Kratz, Quintos & Hanson, LLP

(57) ABSTRACT

An electronic component includes a substrate, and a capacitor unit on the substrate. The capacitor unit has a laminate structure including a first electrode layer provided on the substrate, a second electrode layer opposed to the first electrode layer, and a dielectric layer disposed between the first and the second electrode layers. The first electrode layer has a multilayer structure including an adhesion metal layer joined to the dielectric layer. The adhesion metal layer is provided with an oxide coating on a side of the dielectric layer.

14 Claims, 7 Drawing Sheets

ELECTRONIC COMPONENT

BACKGROUND OF THE INVENTION

1. Field of the Invention

The present invention relates to an electronic component that includes a capacitor provided on a substrate, for example formed by semiconductor processing technology.

2. Description of the Related Art

In a radio frequency (hereinafter, RF) system such as a mobile phone or a wireless LAN, signals have to be subjected to phase-matching for satisfactory transmission among functional devices constituting the system. Accordingly, the input/output terminal of each device is generally provided with a passive component such as an inductor or a capacitor, and that acts as a phase shifter for controlling the phase of the signals.

In the RF system in general, a SAW filter is employed for use as a narrow-band frequency filter. The SAW filter, which includes a piezoelectric element, produces a difference in potential between piezoelectric element electrodes because of a piezoelectric effect, when a physical impact or a thermal effect is applied to the SAW filter or the piezoelectric element thereof during the manufacturing process of the apparatus in which the SAW filter is incorporated. In this case, a predetermined voltage is applied to an electronic component electrically connected to the SAW filter. The capacitor included in the passive element (phase shifter) is usually electrically connected to the SAW filter, and hence the capacitor has to have a high withstand voltage (150 V or higher, for instance), to thereby prevent a dielectric breakdown between the capacitor electrodes, which may take place upon application of a voltage accidentally generated by the SAW filter or the piezoelectric element thereof.

There has been a constant demand for reduction in dimensions of various parts composing the RF system, driven by the increase in number of parts for achieving a higher performance. For making the system smaller in dimensions, an integrated passive device (hereinafter, IPD) manufactured based on a semiconductor processing technology, which includes a plurality of predetermined passive components such as an inductor, a capacitor, a resistance and a filter densely integrated on a substrate, may be employed as the passive element (phase shifter). When employing the IPD, the capacitor included therein still has to have a high withstand voltage, for preventing a dielectric breakdown between the capacitor electrodes, as stated above. Techniques related to the IPD are found, for example, in JP-A-H04-61264 and JP-A-2002-33239.

The capacitor included in the IPD generally has a laminate structure consisting of a lower electrode layer provided on a substrate, an upper electrode layer opposed to the lower electrode layer, and a dielectric layer disposed between the electrode layers. The lower electrode layer and the upper electrode layer are both expected to have low resistance and to achieve sufficient adhesion to the dielectric layer. Insufficient adhesion between the layers provokes deterioration with time in adhesion status between those layers (for example, expansion of a gap between the layers with time), thus causing variation in static capacitance characteristic of the capacitor, which is undesirable.

Conventionally, the lower electrode layer of the capacitor included in the IPD is often constituted of a multilayer structure including Ti/Au/Ni/Au layers. Specifically, such multilayer structure includes a Ti layer (for instance, 50 nm in thickness) provided on a substrate, a first Au layer (for instance, 500 nm in thickness) provided on the Ti layer, a Ni layer (for instance, 50 nm in thickness) provided on the first Au layer, and a second Au layer (for instance, 500 nm in thickness) provided on the Ni layer, such that a minute amount of Ni originating from the Ni layer reaches the surface of the second Au layer on the side of the dielectric layer, because of thermal diffusion. Such multilayer structure is known to have low resistance, and to achieve sufficient adhesion especially to a $SiO_2$ dielectric layer, because of the presence of Ni on the surface of the second Au layer on the side of the dielectric layer.

Employing the Ti/Au/Ni/Au multilayer structure as the lower electrode layer, however, may not always assure the required adhesion performance between the lower electrode layer and the dielectric layer. Also, employing the Ti/Au/Ni/Au multilayer structure as the lower electrode layer may lead to failure in attaining the withstand voltage of a required level in the capacitor. Increasing the thickness of the dielectric layer may help in improving the withstand voltage of the capacitor, however the increase in thickness of the dielectric layer requires as much increase in area of the upper electrode layer, in order to secure the required static capacitance of the capacitor. Therefore, increasing the thickness of the dielectric layer is not a desirable solution, from the view point of suppressing an increase in dimensions of the capacitor, hence the IPD including the capacitor as a component.

SUMMARY OF THE INVENTION

The present invention has been proposed under the foregoing situation, with an object to provide an electronic component including a capacitor unit that assures sufficient adhesion between the lower electrode layer and the dielectric layer, and that facilitates achieving a high withstand voltage.

A first aspect of the present invention provides an electronic component comprising a substrate and a capacitor unit. The capacitor unit has a laminate structure including a first electrode layer (lower electrode layer) provided on the substrate, a second electrode layer (upper electrode layer) opposed to the first electrode layer, and a dielectric layer disposed between the first and the second electrode layers. The first electrode layer has a multilayer structure including an adhesion metal layer joined to the dielectric layer, via an oxide coating provided on a surface of the adhesion metal layer. To form the adhesion metal layer according to the first aspect of the present invention, a metal material oxidizable to such an extent as forming an oxide coating on a surface thereof in an atmosphere of a normal temperature and pressure is deposited, and then the growing facet of the metal layer is actually exposed to air for oxidation. Therefore, the adhesion metal layer according to the first aspect of the present invention is an easily oxidizable metal layer. Also, the electronic component according to the present invention includes the capacitor element itself, and an integrated electronic component in which the capacitor element is integrated with another element.

The present inventors discovered that the lower electrode layer joined to the dielectric layer via a surface coating constituted of an easily oxidizable metal provided on the surface of the lower electrode layer can achieve superior adhesion to the dielectric layer, than the conventional lower electrode layer having the Ti/Au/Ni/Au multilayer structure. The present inventors also discovered that employing the lower electrode layer provided with such metal layer enables achieving a higher withstand voltage than employing the conventional lower electrode layer having the Ti/Au/Ni/Au multilayer structure. The first aspect of the present invention is based on these findings.

In the capacitor unit of the electronic component according to the first aspect of the present invention, the first electrode layer (lower electrode layer) is joined to the dielectric layer via the oxide coating provided on the adhesion metal layer of the first electrode layer. The oxide coating has a metal oxide structure rooted in the metal foundation of the adhesion metal layer. The oxide coating having such metal oxide structure is readily combinable to the dielectric layer, which is generally constituted of silicon oxide, silicon nitride, aluminum oxide, tantalum oxide, or titanium oxide. It is because of such high bonding performance between the oxide coating and the dielectric layer, that the first electrode layer achieves superior adhesion to the dielectric layer. Also, the effect of blocking the flow of electrons from the main portion of the first electrode layer to the dielectric layer, provided by the oxide coating having the metal oxide structure, can be construed to be a reason of the high withstand voltage of the capacitor unit according to the present invention.

Preferably, the adhesion metal layer may contain a metal selected from the group consisting of Ti, Cr, and Ta. Ti, Cr, and Ta are so-called easily oxidizable metals, which are oxidized under a relatively mild condition in a normal atmosphere.

A second aspect of the present invention provides an electronic component comprising a substrate and a capacitor unit. The capacitor unit has a laminate structure including a first electrode layer (lower electrode layer) provided on the substrate, a second electrode layer (upper electrode layer) opposed to the first electrode layer, and a dielectric layer disposed between the first and the second electrode layers. The first electrode layer has a multilayer structure including an adhesion metal layer, containing a metal selected from the group consisting of Ti, Cr and Ta, and joined to the dielectric layer. To form the adhesion metal layer according to the second aspect of the present invention, a metal material containing a metal selected from the group consisting of Ti, Cr and Ta is deposited, but without positively exposing the growing facet of the metal layer to air.

The second aspect of the present invention is, as stated above, based on the finding that the lower electrode layer joined to the dielectric layer via a surface coating constituted of an easily oxidizable metal provided on the surface of the lower electrode layer can achieve superior adhesion to the dielectric layer, than the conventional lower electrode layer having the Ti/Au/Ni/Au multilayer structure, and the finding that employing the lower electrode layer provided with such metal layer enables achieving a higher withstand voltage than employing the conventional lower electrode layer having the Ti/Au/Ni/Au multilayer structure.

Preferably, the first electrode layer may include an adhesion layer, containing the metal contained in the adhesion metal layer and joined to the substrate. Such structure allows improving the formation efficiency of the capacitor unit, and hence the production efficiency of the electronic component. This is because the structure enables, for example when performing a sputtering process with a plurality of targets to form the first electrode layer, simplifying the selection of the targets.

Preferably, the first electrode layer may include a main conductive layer containing a metal selected from the group consisting of Cu, Au, Ag, and Al. Such structure is appropriate in reducing the resistance of the first electrode layer.

Preferably, the electronic component according to the present invention may further comprise an interconnect layer provided on the substrate, and the interconnect layer may have a structure same as the multilayer structure of the first electrode layer, but without the adhesion metal layer. It is preferable that the interconnect layer and the first electrode layer constitute a continuous structure, except for the adhesion metal layer.

Preferably, the electronic component according to the present invention may further comprise a passive component provided on the substrate, such that the interconnect layer constitutes at least a part of an electrical path between the passive component and the capacitor unit. With or instead of such configuration, the electronic component according to the present invention may further comprise an electrode pad provided on the substrate, such that the interconnect layer constitutes at least a part of an electrical path between the electrode pad and the capacitor unit. The electronic component according to the present invention may be an integrated electronic component including the foregoing structures.

DETAILED DESCRIPTION OF THE PREFERRED EMBODIMENTS

Figure 1:
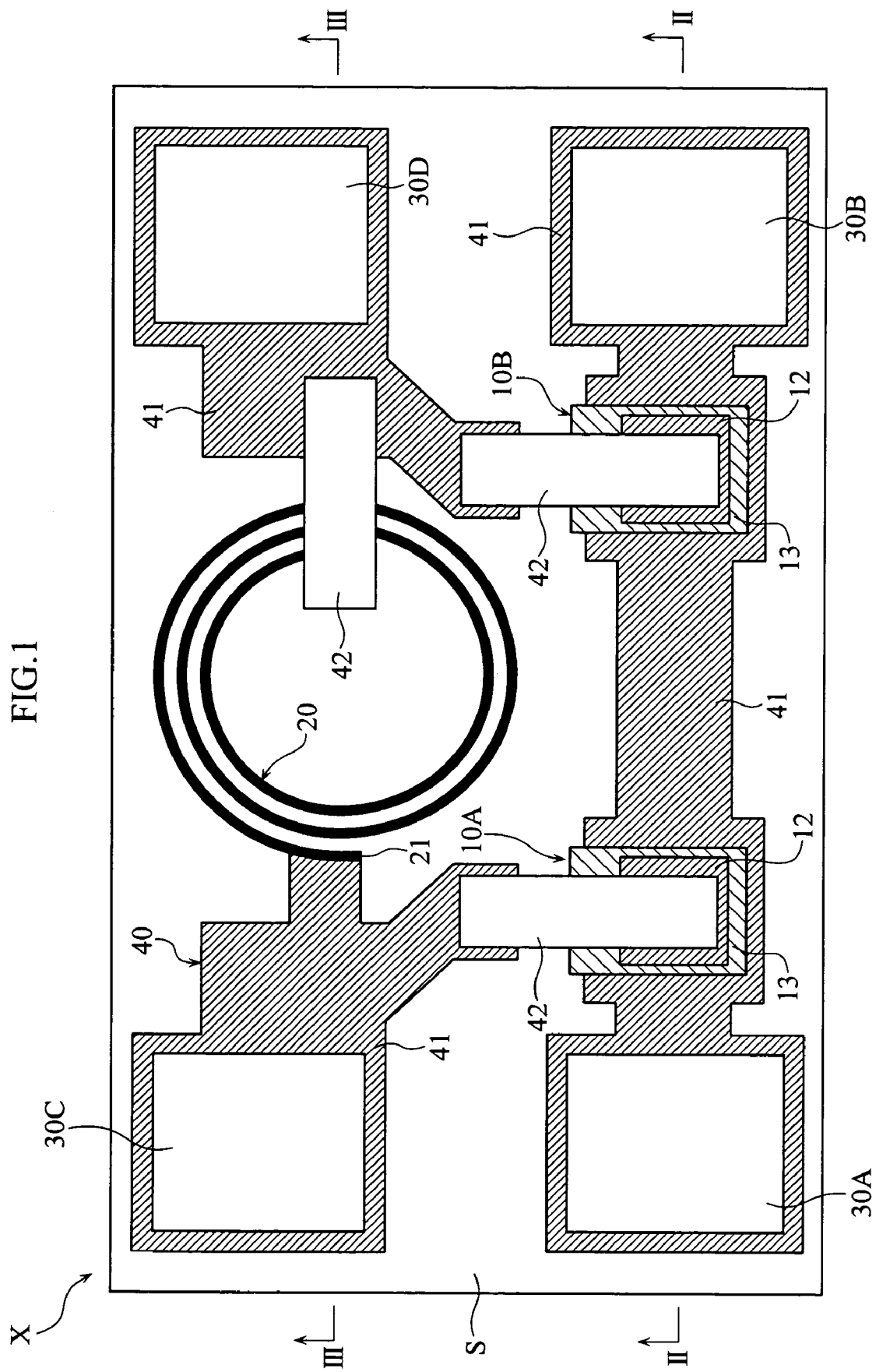
FIG. 1 is a plan view showing an integrated electronic component according to the present invention.
Figure 2:
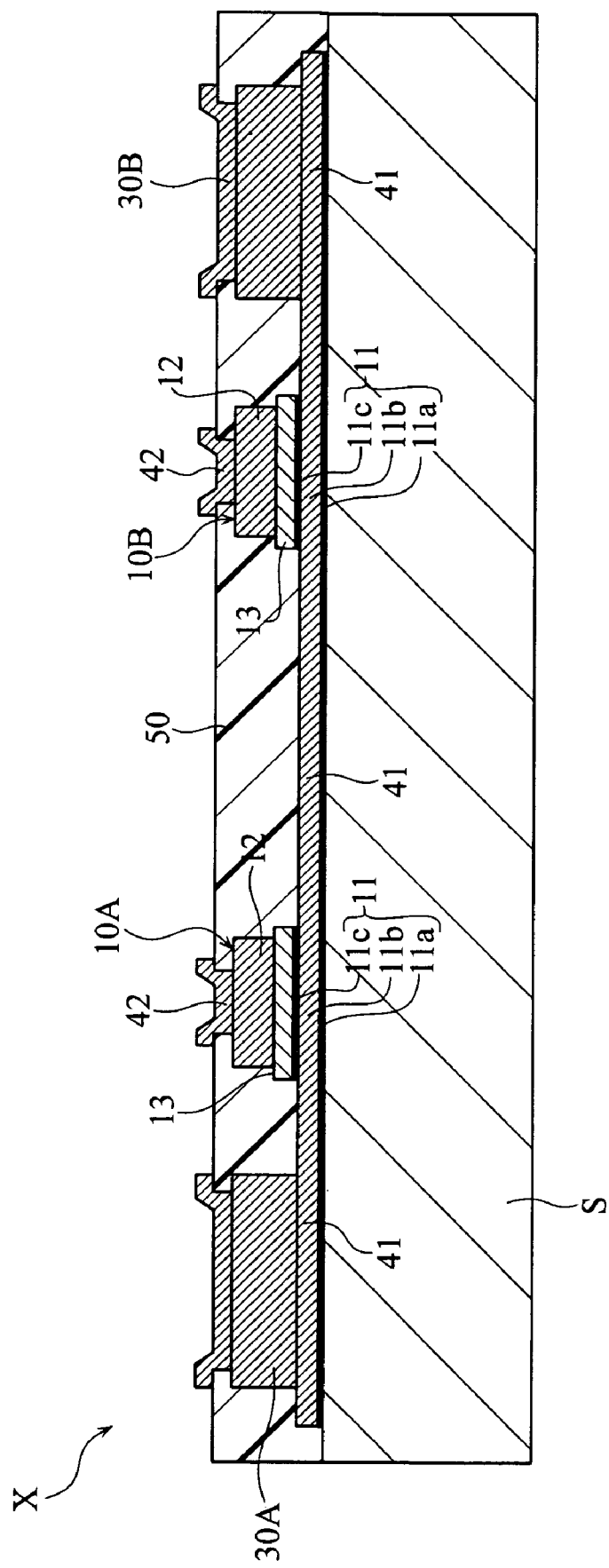
FIG. 2 is a cross-sectional view taken along the line II-II in FIG. 1.
Figure 3:
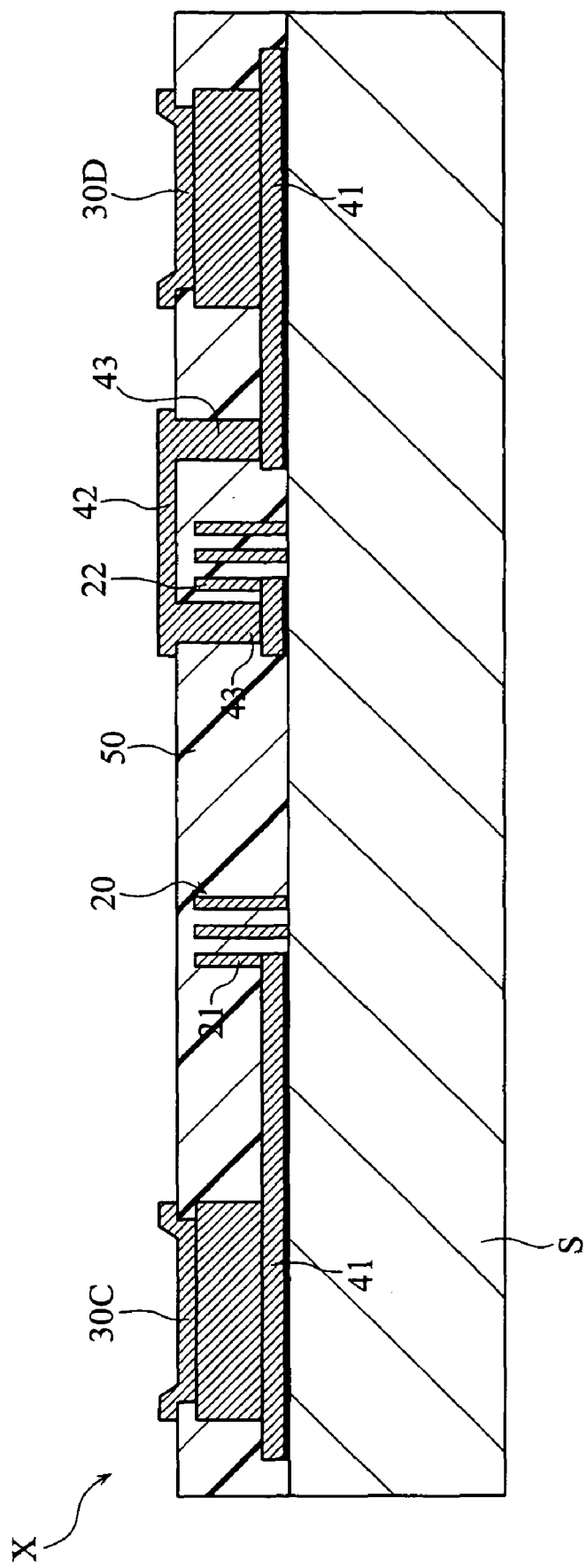
FIG. 3 is a cross-sectional view taken along the line III-III in FIG. 1.

FIGS. 1 to 3 depict an integrated electronic component X according to the present invention. FIG. 1 is a plan view of the integrated electronic component X. FIGS. 2 and 3 are cross-sectional views taken along the line II-II and III-III in FIG. 1, respectively.

Figure 4:
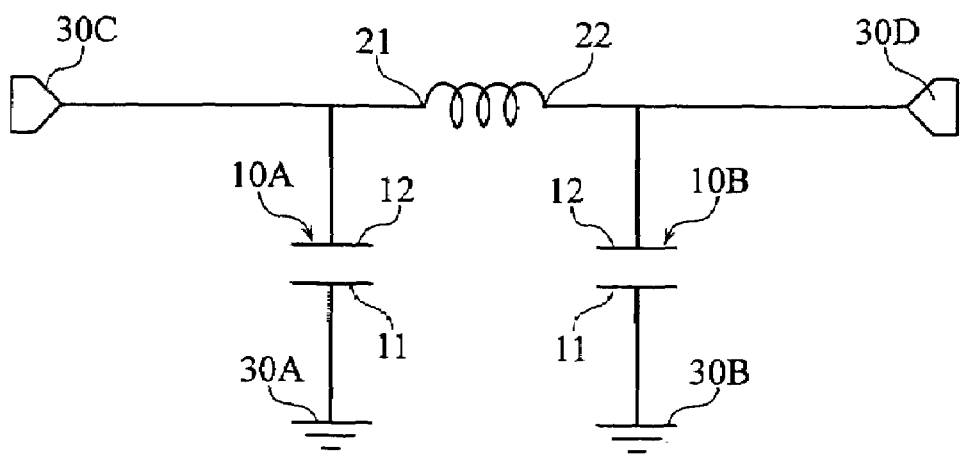
FIG. 4 is a circuit diagram of the integrated electronic component shown in FIG. 1.

The integrated electronic component X includes a substrate S, capacitors 10A, 10B, a coil inductor 20, electrode pads 30A, 30B, 30C, 30D, an interconnect 40, and a cover layer 50 (not shown in FIG. 1), and has a circuit configuration shown in FIG. 4.

The substrate S may be a semiconductor substrate, a quartz substrate, a glass substrate, a silicon on insulator (SOI) substrate, a silicon on quartz (SOQ) substrate, or a silicon on glass (SOG) substrate. The semiconductor substrate may be constituted of a silicon material, such as monocrystalline silicon.

The capacitors 10A, 10B respectively have a laminate structure including electrode layers 11, 12 and a dielectric layer 13. The laminate structure of the capacitors 10A, 10B is shown in FIG. 5.

Figure 5:
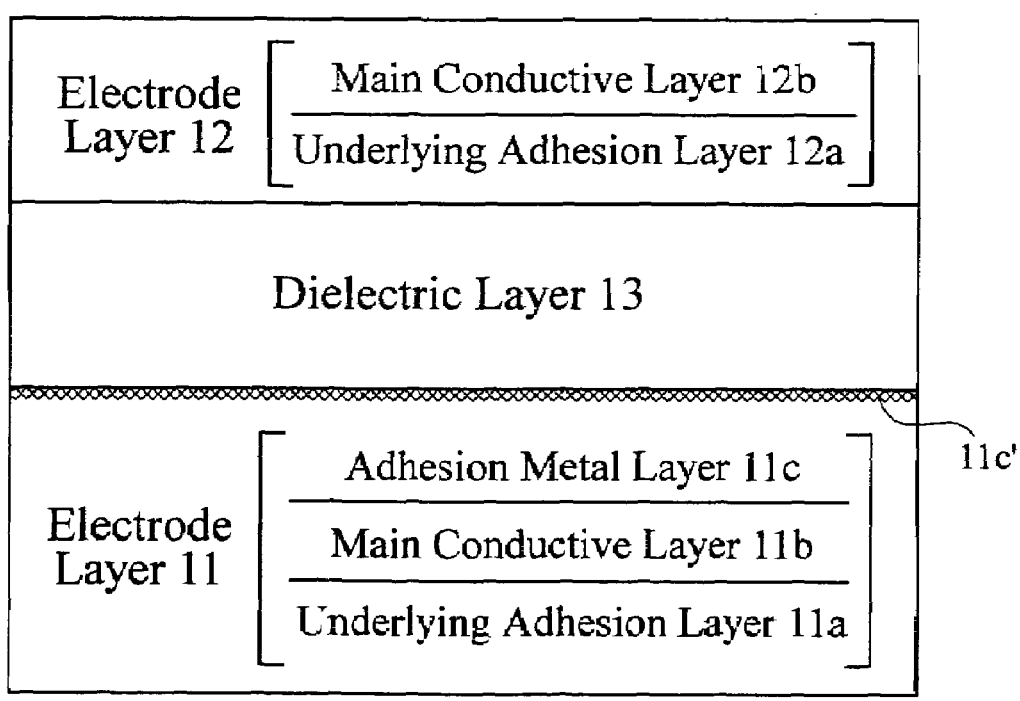
FIG. 5 is a schematic diagram showing a laminate structure of a capacitor unit of the integrated electronic component shown in FIG. 1.
Figure 6:
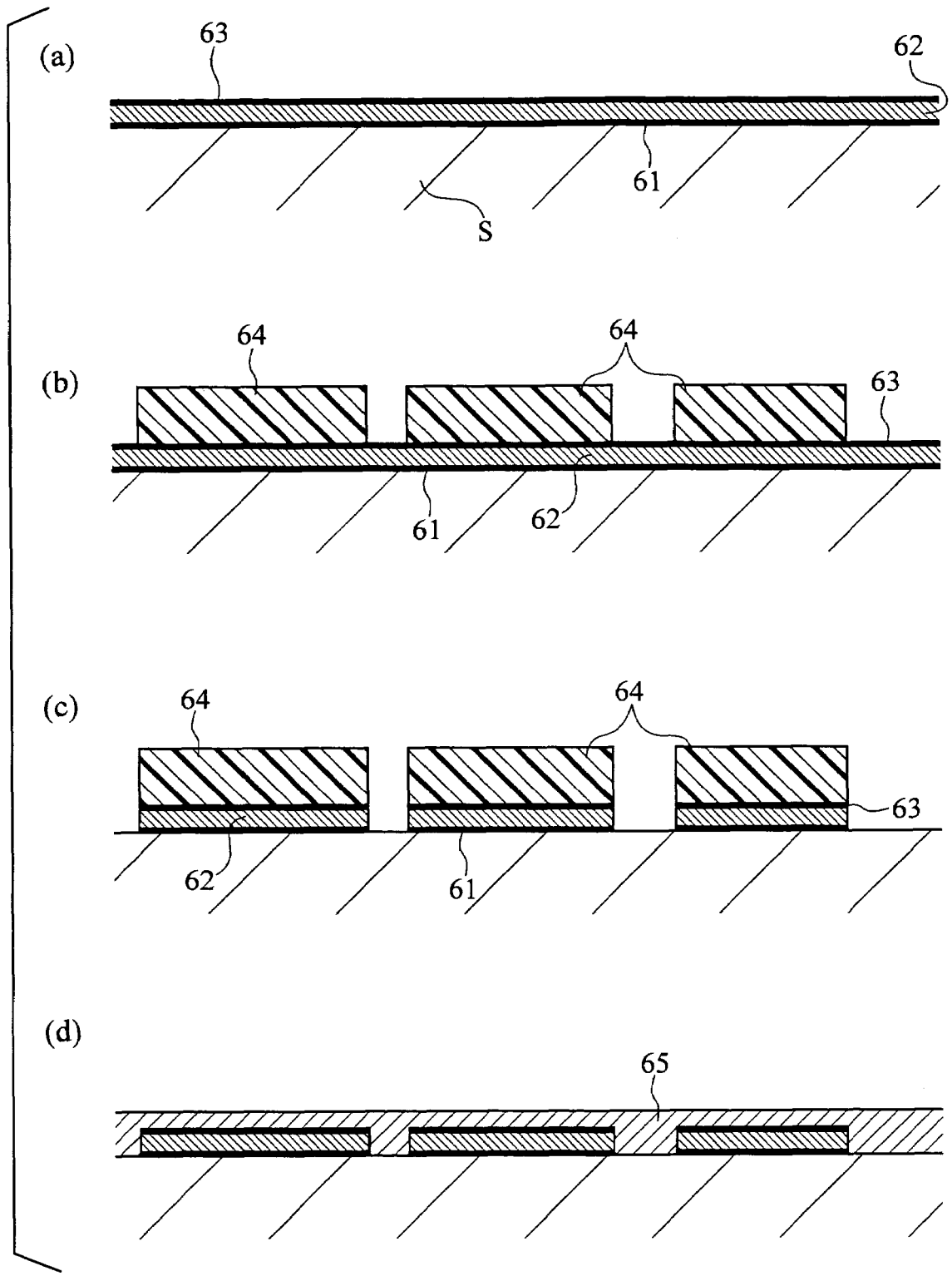
FIGS. 6(a) to 6(d) are cross-sectional views showing a manufacturing method of the integrated electronic component shown in FIG. 1.
Figure 7:
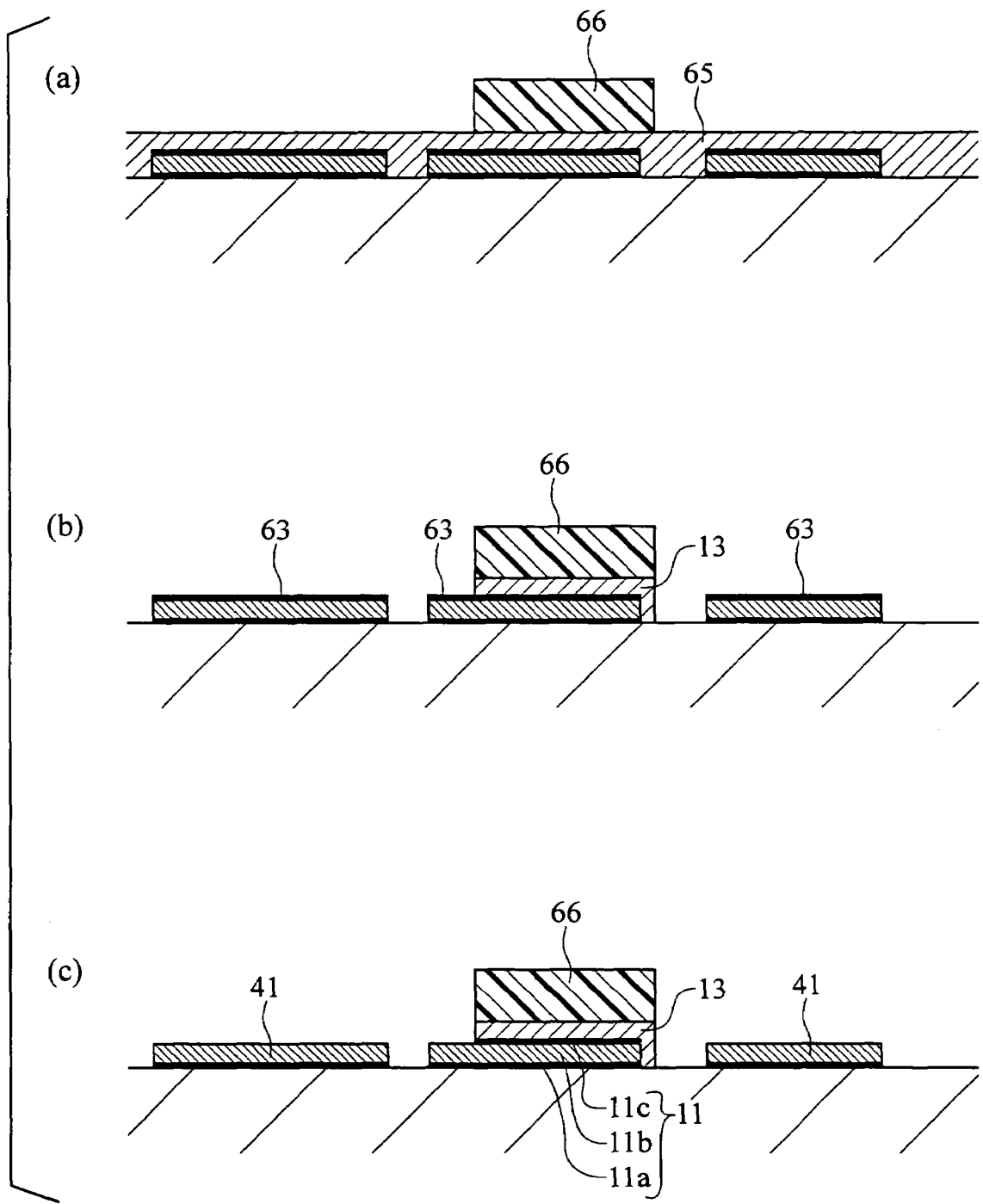
FIGS. 7(a) to 7(c) are cross-sectional views showing the manufacturing method subsequent to FIG. 6(d)
Figure 8:
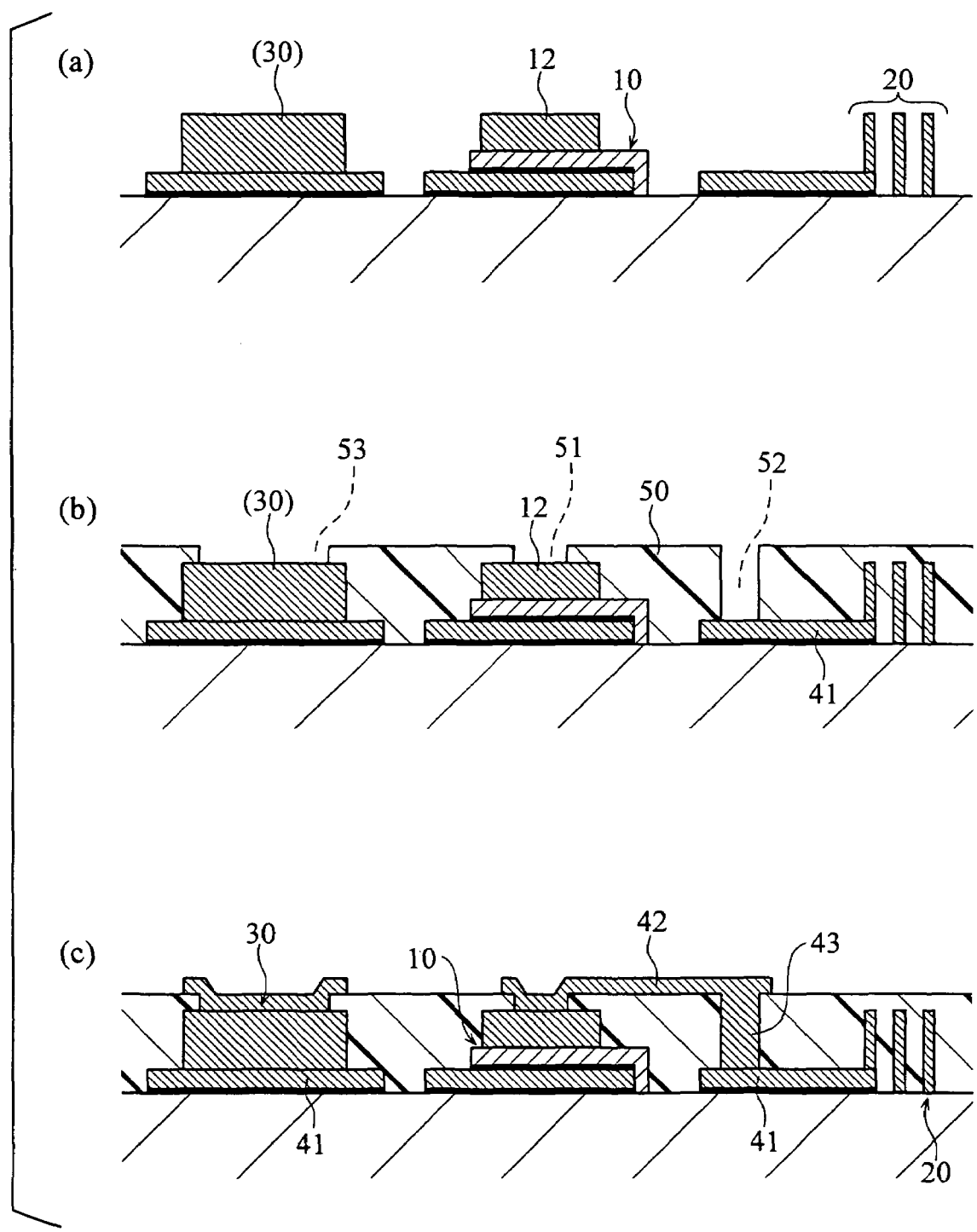
FIGS. 8(a) to 8(c) are cross-sectional views showing the manufacturing method subsequent to FIG. 7(c).

The electrode layer 11 is a lower electrode layer formed in a pattern on the substrate S, and has a laminate structure including an underlying adhesion layer 11a, a main conductive layer 11b and an adhesion metal layer 11c in this embodiment, as shown in FIGS. 2 and 5. The underlying adhesion layer 11a serves to secure sufficient adhesion between the substrate S and the electrode layer 11, and may preferably be constituted of Ti, Cr, or Ta. The underlying adhesion layer 11a has a thickness of, for instance, 30 to 100 nm. The main conductive layer 11b is the principal part of the electrode layer 11, engaged in electrical conduction which is the primary purpose thereof, and may be constituted of Cu, Au, Ag, or Al. The main conductive layer 11b has a thickness of 0.5 to 2 μm, for instance. The adhesion metal layer 11c, which serves to secure sufficient adhesion between the dielectric layer 13 and the electrode layer 11, includes an oxide coating 11c' formed on the surface of the adhesion metal layer 11c confronting the dielectric layer 13 in this embodiment, as schematically shown in FIG. 5. In the present invention, the adhesion metal layer 11c without the oxide coating 11c' provided on the surface thereof confronting the dielectric layer 13 may be employed, instead of the adhesion metal layer 11c provided with such oxide coating 11c'. Examples of the base metal material constituting the adhesion metal layer 11c include Ti, Cr, and Ta. These are so-called easily oxidizable metals, which are oxidized under a relatively mild condition in a normal atmosphere. An overall thickness of the adhesion metal layer 11c thus configured is, for instance, 30 to 100 nm.

The electrode layer 12 is an upper electrode layer formed so as to confront the electrode layer 11 via the dielectric layer 13, and has a laminate structure including an underlying adhesion layer 12a and a main conductive layer 12b in this embodiment, as shown in FIG. 5. The underlying adhesion layer 12a serves to secure sufficient adhesion between the dielectric layer 13 and the electrode layer 12, and may be constituted of Ti, Cr, or Ta. The underlying adhesion layer 12a has a thickness of, for instance, 30 to 100 nm. The main conductive layer 12b is a principal part of the electrode layer 12, engaged in electrical conduction which is the primary purpose thereof, and may be constituted of Cu, Au, Ag, or Al. The main conductive layer 12b may have a thickness of 1 to 15 μm. The electrode layer 12 may have a single layer structure instead of such laminate structure.

The dielectric layer 13 may preferably be constituted of an oxide dielectric or a nitride dielectric, such as silicon oxide, silicon nitride, aluminum oxide, tantalum oxide, or titanium oxide. The dielectric layer 13 may have a thickness of 0.1 to 1 μm.

The coil inductor 20 is a flat spiral coil patterned on the substrate S as shown in FIGS. 1 and 3, and has end portions 21, 22. Preferable materials of the coil inductor 20 include Cu, Au, Ag and Al.

The electrode pads 30A to 30D serve for external connection. The electrode pads 30A, 30B serve as terminals for ground connection, while the electrode pads 30C, 30D serve as input/output terminals of electrical signals. The electrode pads 30A to 30D may be constituted of a Ni body with the upper surface coated with a Au layer.

The interconnect 40 serves to electrically connect the components on the substrate S, and includes a first interconnect region 41 patterned on the substrate S, a second interconnect region 42 patterned mainly on the cover layer 50, and a third interconnect region 43 connecting the first interconnect region 41 and the second interconnect region 42, as shown in FIGS. 1 to 3. For the sake of explicitness of the drawings, only the first interconnect region 41 among the interconnects is indicated by hatching in FIG. 1. The first interconnect region 41 has a structure same as the multilayer structure of the electrode layer 11 of the capacitor units 10A, 10B, but without the adhesion metal layer 11c. In other words, the first interconnect region 41 includes an underlying adhesion layer of the same composition and thickness as those of the underlying adhesion layer 11a, and a main conductive layer of the same composition and thickness as those of the main conductive layer 11b. A portion of the first interconnect region 41 constitutes the electrode layer 11. Preferable materials of the second interconnect region 42 and the third interconnect region 43 include Cu, Au, Ag, and Al. The second interconnect region 42 may have a thickness of 1 to 15 μm.

Referring to FIG. 4, the capacitor 10A is electrically connected to the electrode pads 30A, 30C and the coil inductor 20. More specifically, the electrode layer 11 of the capacitor 10A is electrically connected to the electrode pad 30A, and the electrode layer 12 of the capacitor 10A to the electrode pad 30C and the end portion 21 of the coil inductor 20. Likewise, the capacitor 10B is electrically connected to the electrode pads 30B, 30D and the coil inductor 20. More specifically, the electrode layer 11 of the capacitor 10B is electrically connected to the electrode pad 30B, and the electrode layer 12 of the capacitor 10B to the electrode pad 30D and the other end portion 22 of the coil inductor 20.

The cover layer 50 may be constituted of a polyimide or benzocyclobutene (BCB), and covers the capacitors 10A, 10B, the coil inductor 20, the first interconnect region 41, and the third interconnect region 43.

FIGS. 6(a) to 8(c) illustrate a manufacturing method of the integrated electronic component X. FIGS. 6(a) to 8(c) represent the progress of the formation process of a capacitor 10 (corresponding to the capacitor 10A, 10B), a part of the coil inductor 20, an electrode pad 30 (corresponding to the electrode pads 30A to 30D), and a part of an interconnect 40 shown in FIG. 8(c), in cross-sectional views of a region including these constituents. The cross-sectional views progressively depict a model of a plurality of predetermined regions included in a single section where the integrated electronic component is formed, on a material substrate to be processed.

To manufacture the integrated electronic component X, firstly an underlying layer 61, a main conductive layer 62, and a metal layer 63 with an oxide coating (not shown) provided on the surface thereof are consecutively formed on the substrate S as shown in FIG. 6(a), for example by a sputtering process. The underlying layer 61, the main conductive layer 62, and the metal layer 63 are respectively constituted of the materials cited regarding the underlying adhesion layer 11a, the main conductive layer 11b, and the adhesion metal layer 11c of the electrode layer 11 of the capacitor 10. The metal layer 63 with the oxide coating may be formed by depositing an easily oxidizable metal such as Ti, Cr, or Ta on the main conductive layer 62, and exposing that metal to air. In the integrated electronic component X according to the present invention, when employing the adhesion metal layer 11c without the oxide coating 11c' provided on the side of the dielectric layer 13, instead of the adhesion metal layer 11c with the oxide coating 11c' on the side of the dielectric layer 13, the easily oxidizable metal is not exposed to air after being deposited on the main conductive layer 62, when forming the metal layer 63.

Then a resist pattern 64 is formed, as shown in FIG. 6(b). The resist pattern 64 has a pattern shape corresponding to the electrode layer 11 and the first interconnect region 41 of the capacitor 10. To form the resist pattern 64, a liquid photoresist is firstly deposited on the metal layer 63 by a spin coating process. The photoresist layer is then patterned through an exposure and a subsequent development process. The resist pattern and the cover layer to be described later may also be formed through a similar process.

Proceeding to FIG. 6(c), for example an ion milling process is performed utilizing the resist pattern 64 as the mask, so as to etch on the underlying layer 61, the main conductive layer 62, and the metal layer 63. A predetermined stripping solution is then applied to remove the resist pattern 64.

Then a dielectric layer 65 as shown in FIG. 6(d), by a sputtering process for instance. The dielectric layer 65 is constituted of one of the materials cited regarding the dielectric layer 13 of the capacitor 10.

Proceeding to FIG. 7(a), a resist pattern 66 is formed on the dielectric layer 65. The resist pattern 66 has a pattern shape corresponding to the dielectric layer 13 of the capacitor 10.

A wet etching process is then performed on the dielectric layer 65 utilizing the resist pattern 66 as the mask, as shown in FIG. 7(b). As a result, the dielectric layer 13 is shaped in a predetermined pattern. Suitable etching solutions for such wet etching process include buffered fluoric acid.

Then an exposed portion of the metal layer 63 is removed as shown in FIG. 7(c), by an etching process utilizing the resist pattern 66 and the dielectric layer 13 as the mask. At this stage, the electrode layer 11 and the first interconnect region 41 of the capacitor 10 are patterned. Suitable etching processes include an ion milling process and a wet etching process. Upon completing this process, the resist pattern 66 is removed.

Proceeding to FIG. 8(a), an electroplating process is performed with a predetermined resist pattern (not shown), so as to grow a conductive material at predetermined positions. At this stage, the electrode layer 12 of the capacitor 10, the coil inductor 20, and the main part of the electrode pad 30 are formed.

The cover layer 50 is then formed as shown in FIG. 8b). The cover layer 50 is formed with openings 51, 52, 53, through which a portion of the electrode layer 12, a portion of the first interconnect region 41, and a portion of the main part of the electrode pad 30, respectively.

Finally as shown in FIG. 8(c), an electroplating process is performed with a predetermined resist pattern (not shown), so as to grow a conductive material at predetermined positions. As a result, the second interconnect region 42, the third interconnect region 43, and the surface layer of the electrode pad 30 are formed. Throughout the foregoing process, the integrated electronic component X shown in FIG. 1 can be manufactured.

Whereas the present invention is, as already stated, based on the finding that the lower electrode layer joined to the dielectric layer via a surface coating constituted of an easily oxidizable metal provided on the surface of the lower electrode layer can achieve superior adhesion to the dielectric layer, than the conventional lower electrode layer having the Ti/Au/Ni/Au multilayer structure, as well as on the finding that employing the lower electrode layer provided with such metal layer enables achieving a higher withstand voltage than employing the conventional lower electrode layer having the Ti/Au/Ni/Au multilayer structure, the electrode layer 11 (lower electrode layer) of the capacitor units 10A, 10B in the integrated electronic component X is joined to the dielectric layer 13 via the oxide coating 11c' (shown in FIG. 5) of the adhesion metal layer 11c included in the electrode layer 11. The oxide coating 11c' has a metal oxide structure rooted in the metal foundation of the adhesion metal layer 11c. The oxide coating 11c' having such metal oxide structure is readily combinable to the dielectric layer 13 (constituted of silicon oxide, silicon nitride, aluminum oxide, tantalum oxide, titanium oxide or the like). Accordingly, the electrode layer 11 can achieve excellent adhesion to the dielectric layer 13. Also, the oxide coating 11c' having the metal oxide structure blocks the flow of electrons from the metal foundation of the main conductive layer 11b and the adhesion metal layer 11c in the electrode layer 11 to the dielectric layer 13, thus granting a high withstand voltage to the capacitors 10A, 10B. Thus, the capacitors 10A, 10B of the integrated electronic component X can achieve excellent adhesion between the electrode layer 11 (lower electrode layer) and the dielectric layer 13, as well as a high withstand voltage.

WORKING EXAMPLE

A plurality of capacitor elements was fabricated according to the present invention. When forming the respective capacitors, capacitor units having a laminate structure configured as FIG. 5 under the following conditions, were made on a glass substrate. The underlying adhesion layer 11a of the electrode layer 11 was a Ti layer of 50 nm in thickness. The main conductive layer 11b was a Au layer of 1000 nm in thickness. The adhesion metal layer 11c was a Ti layer of 50 nm in thickness, including an oxide coating on its surface. The electrode layer 12 was an electroplated Cu layer of 10 μm in thickness. The dielectric layer 13 was a $SiO_2$ layer of 220 nm in thickness.

COMPARATIVE EXAMPLE

A plurality of capacitor elements was fabricated for comparison. To form the respective capacitor elements, similar capacitor units were fabricated on a glass substrate, except that the electrode layer 11 was substituted with the following lower electrode layer. The lower electrode layer according to the comparative example had a laminate structure including a Ti layer of 50 nm in thickness provided on the glass substrate, a first Au layer of 500 nm in thickness on the Ti layer, a Ni layer of 50 nm in thickness on the first Au layer, and a second Au layer of 500 nm in thickness on the Ni layer, and a minute amount of Ni originating from the Ni layer was brought to the surface of the second Au layer on the side of the dielectric layer, by thermal diffusion.

<Evaluation>
<High Temperature/High Humidity Test>

The plurality of capacitor elements according to the working example and those according to the comparative example were subjected to a high temperature/high humidity test. The capacitor elements were kept under a condition of 85 degree centigrade in environmental temperature and 95% in humidity, for 1000 hours. As a result, the plurality of capacitor elements according to the working example showed no variation in capacitance value before and after the test, and no delamination was observed between the electrode layer 11 (lower electrode layer) and the dielectric layer 13. In contrast, some of the capacitor elements according to the comparative example incurred a significant drop in capacitance after the test, and delamination was observed between the lower electrode layer and the dielectric layer, in those capacitor elements with the lowered capacitance. The delamination was confirmed by observation through a SEM with respect to predetermined cross-sections presented upon applying a focused ion beam (FIB) to the capacitor elements. Such result of the high temperature/high humidity test proves that the capacitor elements according to the working example are superior in adhesion between the lower electrode layer and the dielectric layer, to the capacitor elements according to the comparative example.

<Heat Resistance Test>

Another plurality of capacitor elements according to the working example and another plurality of capacitor elements according to the comparative example were subjected to a heat resistance test. The capacitor elements were subjected to four cycles of rise and fall of environmental temperature, in each of which the temperature was raised from 150 to 260 degree centigrade, and then lowered from 260 to 150 degree centigrade. As a result, no delamination was observed between the electrode layer 11 (lower electrode layer) and the dielectric layer 13 in the capacitor elements according to the working example. In contrast, delamination was observed between the lower electrode layer and the dielectric layer, in some of the capacitor elements according to the comparative example. The delamination was confirmed by observation through a SEM with respect to predetermined cross-sections presented upon applying a FIB to the capacitor elements. Such result of the heat resistance test also proves that the capacitor elements according to the working example are superior in adhesion between the lower electrode layer and the dielectric layer, to the capacitor elements according to the comparative example.

<Measurement of Withstand Voltage>

The withstand voltage was measured with respect to the capacitor elements according to the working example and the comparative example. The withstand voltages of the capacitor elements according to the working example and the comparative example were 230 V and 140 V respectively. Thus, the capacitor elements according to the working example proved to have a higher withstand voltage than the capacitor elements according to the comparative example.

The invention claimed is:

1. An electronic component comprising:
    a substrate;
    a capacitor unit having a laminate structure including a first electrode layer provided on the substrate, a second electrode layer opposed to the first electrode layer, and a dielectric layer disposed between the first and the second electrode layers; and
    an interconnect layer provided on the substrate;
    wherein the first electrode layer has a multilayer structure including an adhesion metal layer joined directly to the dielectric layer, the adhesion metal layer being provided with an oxide coating on a side of the dielectric layer;
    wherein the interconnect layer has a multilayer structure same as the multilayer structure of the first electrode layer with the adhesion metal layer removed, and wherein the interconnect layer is continuous with a portion of the first electrode layer other than the adhesion metal layer.

2. The electronic component according to claim 1, wherein the adhesion metal layer contains a metal selected from a group consisting of Ti, Cr, and Ta.

3. An electronic component comprising:
    a substrate;
    a capacitor unit having a laminate structure including a first electrode layer provided on the substrate, a second electrode layer opposed to the first electrode layer, and a dielectric layer disposed between the first and the second electrode layers; and
    an interconnect layer provided on the substrate;
    wherein the first electrode layer has a multilayer structure including an adhesion metal layer that contains a metal selected from a group consisting of Ti, Cr, and Ta, and that is joined directly to the dielectric layer;
    the interconnect layer has a multilayer structure same as the multilayer structure of the first electrode layer with the adhesion metal layer removed, and wherein the interconnect layer is continuous with a portion of the first electrode layer other than the adhesion metal layer.

4. The electronic component according to claim 2, wherein the first electrode layer includes an adhesion layer that contains the metal contained in the adhesion metal layer, and that is joined directly to the substrate.

5. The electronic component according to claim 1, wherein the first electrode layer includes a main conductive layer containing a metal selected from a group consisting of Cu, Au, Ag, and Al.

6. The electronic component according to claim 1, further comprising a passive component provided on the substrate, wherein the interconnect layer constitutes at least part of an electrical path between the passive component and the capacitor unit.

7. The electronic component according to claim 1, further comprising an electrode pad provided on the substrate, wherein the interconnect layer constitutes at least part of au electrical path between the electrode pad and the capacitor unit.

8. The electronic component according to claim 3, wherein the first electrode layer includes an adhesion layer that contains the metal contained in the adhesion metal layer, and that is joined directly to the substrate.

9. The electronic component according to claim 2, wherein the first electrode layer includes a main conductive layer containing a metal selected from a group consisting of Cu, Au, Ag, and Al.

10. The electronic component according to claim 3, wherein the first electrode layer includes a main conductive layer containing a metal selected from a group consisting of Cu, Au, Ag, and Al.

11. The electronic component according to claim 2, further comprising a passive component provided on the substrate, wherein the interconnect layer constitutes at least part of an electrical path between the passive component and the capacitor unit.

12. The electronic component according to claim 3, further comprising a passive component provided on the substrate, wherein the interconnect layer constitutes at least part of an electrical path between the passive component and the capacitor unit.

13. The electronic component according to claim 2, further comprising an electrode pad provided on the substrate, wherein the interconnect layer constitutes at least part of an electrical path between the electrode pad and the capacitor unit.

14. The electronic component according to claim 3, further comprising an electrode pad provided on the substrate, wherein the interconnect layer constitutes at least part of an electrical path between the electrode pad and the capacitor unit.

* * * * *